(12) United States Patent
Baney et al.

(10) Patent No.: US 6,376,826 B1
(45) Date of Patent: Apr. 23, 2002

(54) POLARITY-INDEPENDENT OPTICAL RECEIVER AND METHOD FOR FABRICATING SAME

(75) Inventors: Douglas M. Baney, Los Altos; Christopher Kocot, Palo Alto, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/534,701

(22) Filed: Mar. 24, 2000

(51) Int. Cl.$^7$ ................................................. H01J 40/14
(52) U.S. Cl. ........................ 250/214 R; 250/214.1; 327/515
(58) Field of Search ...................... 250/214.1, 214 R, 250/551; 327/515

(56) References Cited

U.S. PATENT DOCUMENTS

| | | | | |
|---|---|---|---|---|
| 4,785,191 A | * | 11/1988 | Ondris | 358/482 |
| 5,214,275 A | * | 5/1993 | Freeman et al. | 250/208.4 |
| 5,892,220 A | * | 4/1999 | Woodward | 250/214 R |
| 5,920,065 A | * | 7/1999 | Sun et al. | 250/214.1 |

* cited by examiner

Primary Examiner—Stephone Allen
Assistant Examiner—Eric J Spears

(57) ABSTRACT

A polarity-independent optical receiver is constructed so that the bias voltage applied to the optical receiver may be applied in a polarity-independent manner. The polarity-independent optical receiver is also constructed in a balanced arrangement, thus providing the ability to effectively suppress common-mode intensity noise present at the optical receiver. The polarity-independent optical receiver may advantageously be fabricated using metal-semiconductor-metal (MSM) technology.

22 Claims, 6 Drawing Sheets

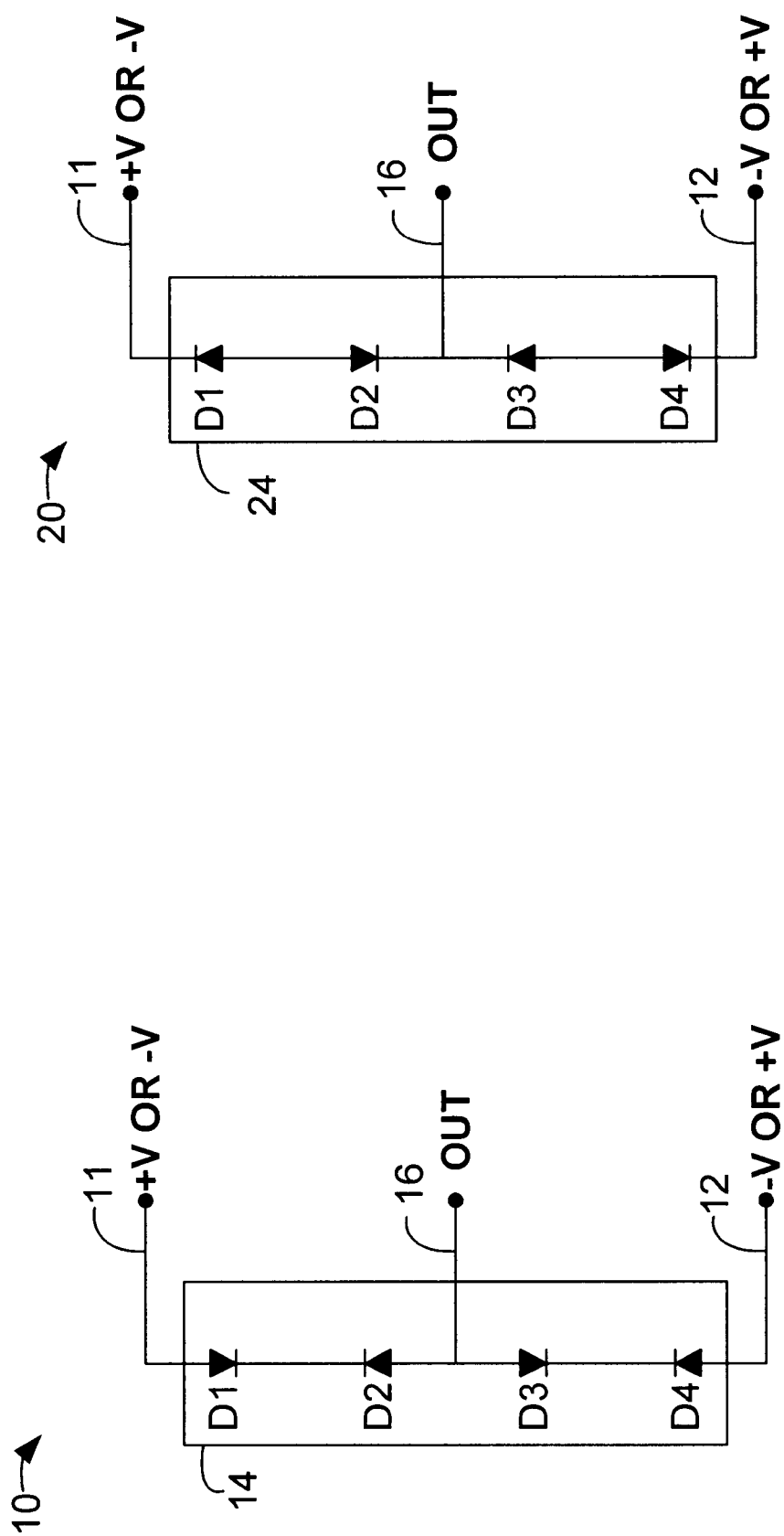

POLARITY-INDEPENDENT OPTICAL RECEIVER AND METHOD FOR FABRICATING SAME

TECHNICAL FIELD

The invention relates generally to electro-optical devices, and, more particularly, to a polarity-independent optical receiver and a method for fabricating same.

BACKGROUND OF THE INVENTION

Optical receivers are useful for detecting light and converting the detected light to a corresponding electrical signal. The electrical signal may be measured, and thus, the intensity of the light can be determined. When detecting and measuring coherent light using interferometric or heterodyne techniques, both the interferometric or heterodyne mixing terms as well as the direct intensity of the light are detected. A portion of the direct intensity of the light includes noise. The direct intensity detection can interfere with the desired heterodyne mixed signal, especially when the intermediate frequency (IF) falls within the direct-detection bandwidth.

One manner in which to reduce the amount of noise is to use an optical receiver having two photodetectors (e.g., photodiodes) arranged in a head to toe configuration as shown in FIG. 1. The photodiode configuration of FIG. 1 has been used with PIN-type photodiodes to suppress the common-mode intensity noise when the photodiodes are illuminated by light having a differential signal, wherein a common-mode intensity noise appears at their respective light terminals.

PIN-type photodiodes are ones in which an intrinsic region separates a p-type material from an n-type material. The operation of PIN-type photodiodes is known to those having ordinary skill in the art. In FIG. 1, optical receiver 1 includes photodiode 6 and photodiode 7 configured in a balanced detector configuration. When a negative voltage is applied to terminal 2 and a positive voltage is applied to terminal 4, both photodiodes 6 and 7 become reverse biased. Upon the application of light, denoted by hv, to the absorption regions associated with photodiodes 6 and 7, the photodiodes will begin to generate an electrical current proportional to the intensity of light impinging on the photodiodes. Photodiodes 6 and 7 are said to be configured in a balanced detector arrangement because when light is applied to photodiode 6, an electrical current will be generated between terminal 2 and terminal 3, and when light is applied to photodiode 7, an electrical current will be generated between terminal 4 and terminal 3. Terminal 3 is the virtual common-mode ground and is the output terminal of the optical receiver 1. If an equal intensity of light is received by photodiodes 6 and 7, then current will flow between terminals 2 and 4, however, no current will appear at terminal 3, the virtual common-mode ground. This condition is preferable in situations in which it is desirable to suppress common-mode intensity noise corresponding to the light applied to photodiodes 6 and 7.

This balanced detector arrangement is useful in optical interferometric systems in which the detected optical signals are differential. Differential optical signals are those that are out of phase with each other, but the noise associated with them has an in-phase component. In the balanced detector arrangement, the common-mode intensity noise is canceled at the virtual common-mode ground terminal 3, thus effectively suppressing the common-mode intensity noise.

A drawback with this configuration is that the photodiodes must be biased by the application of a voltage at a certain polarity as indicated in FIG. 1. This prevents the application of bias chopping or gating where polarities at terminals 2 and 4 are periodically reversed. Bias chopping is important to translate low-frequency detected signals to higher frequencies to reduce the effect of low-frequency electronic noise. Forward biasing the conventional arrangement shown in the prior art of FIG. 1 destroys the photodiodes. Therefore, with this type of photodetector design, careful bias structures must be implemented to avoid damage to the photodiodes.

Furthermore, the voltage polarity will differ from one photodiode to the next depending on whether the photodiode is of a p-type material side up configuration or a p-type material side down configuration. This polarity confusion may lead to rework of the optical receiver if it is incorrectly biased, and possibly destruction of the device due to the application of incorrect bias voltage polarity.

Therefore, there is a need in the industry for a polarity-independent optical receiver having a balanced detector arrangement.

SUMMARY OF THE INVENTION

The invention is a polarity-independent optical receiver having a balanced detector arrangement and a method for fabricating same.

In architecture, the invention can be conceptualized a polarity-independent optical receiver, comprising a first pair of photodiodes serially connected between a first terminal and a common terminal, a second pair of photodiodes serially connected between a second terminal and the common terminal, wherein each of the photodiodes in the first pair and the second pair is oppositely oriented such that a polarity-independent bias voltage may be applied to the first terminal and the second terminal.

The invention can also be conceptualized as a method for making a polarity-independent optical receiver, the method comprising the steps of forming a first pair of photodiodes serially connected between a first terminal and a common terminal, forming a second pair of photodiodes serially connected between a second terminal and the common terminal, and oppositely orienting each of the photodiodes in the first pair and the second pair such that a polarity-independent bias voltage may be applied to the first terminal and the second terminal.

An advantage of the invention is that it provides a polarity-independent optical receiver having a balanced detector arrangement.

Another advantage of the invention is that it removes uncertainty when biasing an optical receiver.

Another advantage of the invention is that allows polarity-independent biasing of an optical receiver.

Another advantage of the invention is that it is simple in design and easily implemented on a mass scale for commercial production.

Other features and advantages of the invention become apparent to one with skill in the art upon examination of the following drawings and detailed description. These additional features and advantages are intended to be included herein within the scope of the invention.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the invention.

FIG. 3 is a schematic diagram illustrating a preferred embodiment of the polarity-independent optical receiver of FIG. 2;

FIG. 4 is a schematic diagram illustrating a first alternative embodiment of the polarity-independent optical receiver of FIG. 3;

DETAILED DESCRIPTION OF THE INVENTION

While the following description will include reference to discrete elements and circuit blocks, the polarity-independent optical receiver of the invention can be fabricated using a variety of semiconductor technologies. The fabrication of the polarity-independent optical receiver of the invention using metal-semiconductor-metal (MSM) technology will be described below as merely one manner of fabricating the optical receiver. Other fabrication methodologies are contemplated.

Figure 1:
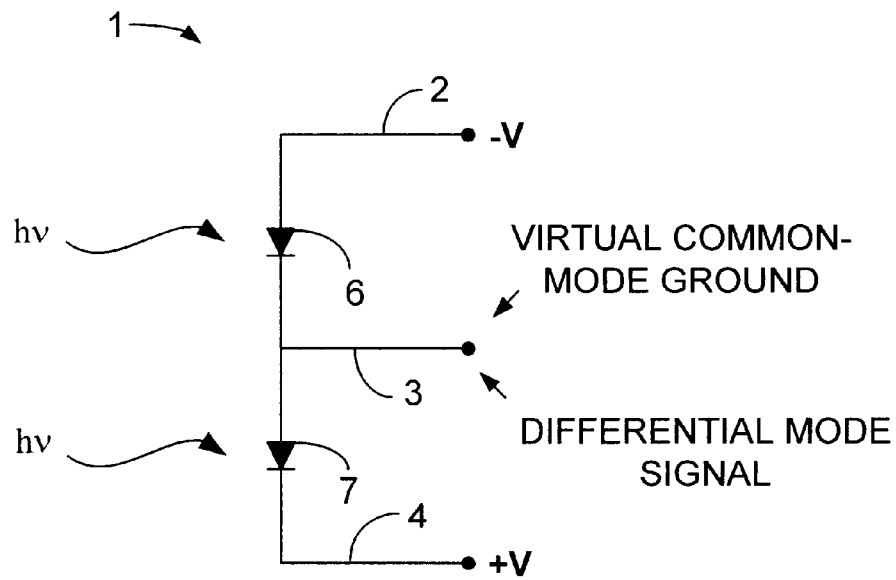
FIG. 1 is a schematic diagram illustrating a prior art optical receiver in a balanced photodetector arrangement.
Figure 2:
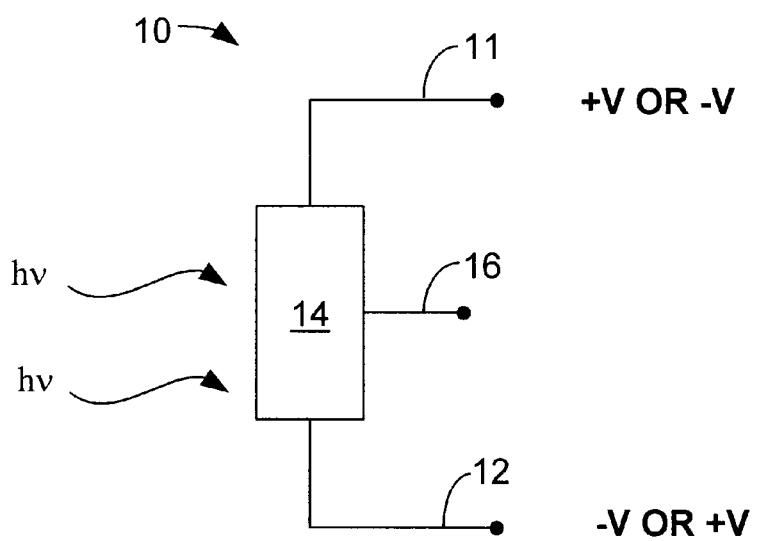
FIG. 2 is a schematic view illustrating a polarity-independent optical receiver constructed in accordance with the invention.

Turning now to the drawings, FIG. 2 is a schematic view illustrating a polarity-independent optical receiver 10 constructed in accordance with the invention. Optical receiver 10 includes photodetector circuitry 14 having terminals 11, 12 and 16. In accordance with the invention, terminal 11 and terminal 12 can have either a positive or a negative bias voltage applied thereto. Terminal 16 is the output terminal of photodetector circuitry 14, and is referred to as the virtual common-mode ground terminal. Photodetector circuitry 14 has a structure that enables it to function regardless of the polarity of the bias voltage applied to it. In this manner, a positive or negative bias voltage can be applied to terminals 11 and 12 without compromising the photodetector circuitry 14.

FIG. 3 is a schematic view illustrating a preferred embodiment of the polarity-independent optical receiver 10 of FIG. 2. Photodetector circuitry 14 includes photodiodes D1, D2, D3 and D4 connected in series in order between terminals 11 and 12, with terminal 16 connected to the junction of D2 and D3. In this arrangement, photodiodes D1 and D2 are connected cathode-to-cathode, photodiodes D3 and D4 are connected cathode-to-cathode, and photodiodes D2 and D3 are connected anode-to-anode to form a balanced detector. As mentioned above, and in accordance with the invention, either a positive or a negative bias voltage can be applied to terminals 11 and 12. For example, when a positive bias voltage is applied to terminal 11 and a negative bias voltage is applied to terminal 12, photodiodes D2 and D4 will be reverse biased and photodiodes D1 and D3 will be forward biased.

Photodiodes operate properly when reverse biased. In the absence of a light source, photodiodes D2 and D4 will not allow any current to flow in the circuit. When light is applied to, and detected by, photodiode pair D1 and D2, a current proportional to the detected light will flow between terminals 11 and 16. The light is detected by photodiode pair D1 and D2 creating a photocurrent which flows through photodiode D2, which is forward biased, and through photodiode D1, which is reverse biased. Similarly, if the light is applied to, and detected by, photodiode pair D3 and D4, a current proportional to the detected light will flow between terminals 12 and 16. The light is detected by photodiode pair D3 and D4 creating a photocurrent which flows through photodiode D3, which is forward biased, and through photodiode D4, which is reverse biased. If both pairs of photodiodes detect light, then the photodetector circuitry 14 will function as a balanced detector. In such an arrangement, when both pairs of photodiodes detect the same light intensity, a current proportional to the detected light will flow between terminals 11 and 12. No current will appear at terminal 16 (the virtual common-mode ground terminal), thereby suppressing the common-mode intensity noise corresponding to the light applied to the photodiodes. This corresponds to the appearance of a differential mode signal at terminal 16. This signal may be used to drive, for example, an electronic amplifier (not shown).

If a negative bias voltage is applied to terminal 11 and a positive bias voltage is applied to terminal 12, then photodiodes D2 and D4 will be forward biased and photodiodes D1 and D3 will be reverse biased. Photodiodes D1 and D3 will then operate in similar manner to photodiodes D2 and D4 described above when a positive bias voltage was applied to terminal 11 and a negative bias voltage was applied to terminal 12.

Importantly, it should be noted that in FIG. 3, there are two photodiodes that will always be forward biased and two photodiodes that will always be reverse biased regardless of the polarity of the bias voltage applied to terminals 11 and 12. In this manner, photodetector circuitry 14 provides a balanced photodetector arrangement that functions independently of the polarity of the bias voltage applied thereto. In this manner, an optical receiver constructed in accordance with that shown in FIG. 3 can easily be connected to an arbitrary bias voltage source without regard to polarity and without fear of damaging the device or having the device render an unusable output signal.

FIG. 4 is a schematic diagram illustrating a first alternative embodiment 20 of the polarity-independent optical receiver 10 of FIG. 3. As shown in FIG. 4, photodetector circuitry 24 includes photodiodes D1, D2, D3 and D4 connected in series. However, in FIG. 4, each photodiode D1 through D4 is illustrated having a polarity opposite of that shown with respect to FIG. 3. The arrangement shown in FIG. 4 still provides two forward biased photodiodes and two reverse biased photodiodes regardless of the polarity of the bias voltage applied to terminals 11 and 12, thus resulting in the same function as that described with respect to FIG. 3.

Figure 5:
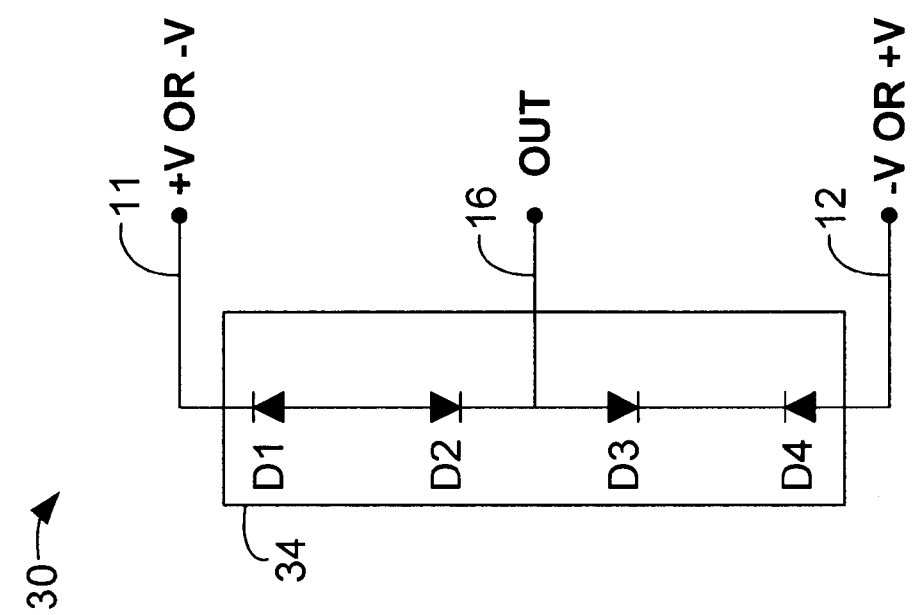
FIG. 5 is a schematic diagram illustrating a second alternative embodiment of the polarity-independent optical receiver of FIG. 3.

FIG. 5 is a schematic diagram illustrating a second alternative embodiment 30 of the polarity-independent optical receiver 10 of FIG. 3. As shown in FIG. 5, optical receiver 30 includes photodetector circuitry 34, which includes photodiodes D1, D2, D3 and D4 connected in series. However, in the arrangement shown in FIG. 5, photodiodes D1 and D2 are illustrated having a polarity opposite of that shown with respect to FIG. 3. In accordance with the invention, regardless of the polarity of the bias voltage applied to terminals 11 and 12, two photodiodes will always be forward biased and two photodiodes will always be reverse biased upon the application of a polarity-independent bias voltage to terminals 11 and 12. This results in the balanced photodetector arrangement as described above.

Figure 6:
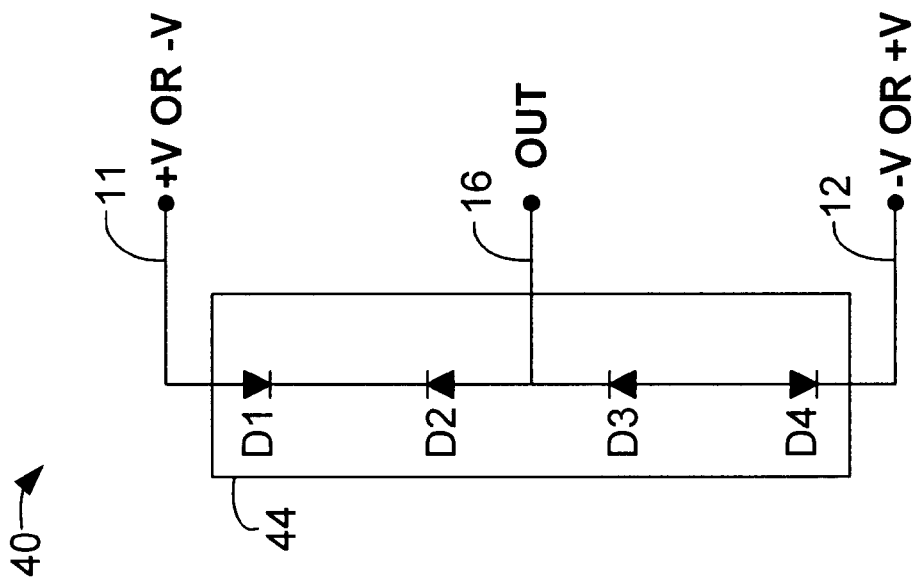
FIG. 6 is a schematic diagram illustrating a third alternative embodiment of the polarity-independent optical receiver of FIG. 3.

FIG. 6 is a schematic diagram illustrating a third alternative embodiment 40 of the polarity-independent optical receiver 10 of FIG. 3. Optical receiver 40 in FIG. 6 includes photodetector circuitry 44, which also includes photodiodes D1, D2, D3 and D4 connected in series. However, photodiodes D3 and D4 are shown having a polarity opposite of that shown in FIG. 3. However, as mentioned above, regardless of the polarity of the bias voltage applied to terminals 11 and 12, the photodetector circuitry 44 shown in FIG. 6 will provide a balanced detector function in which two photodiodes will be reverse biased and two photodiodes will be forward biased upon the application of a polarity-independent bias voltage to terminals 11 and 12.

Figure 7A:
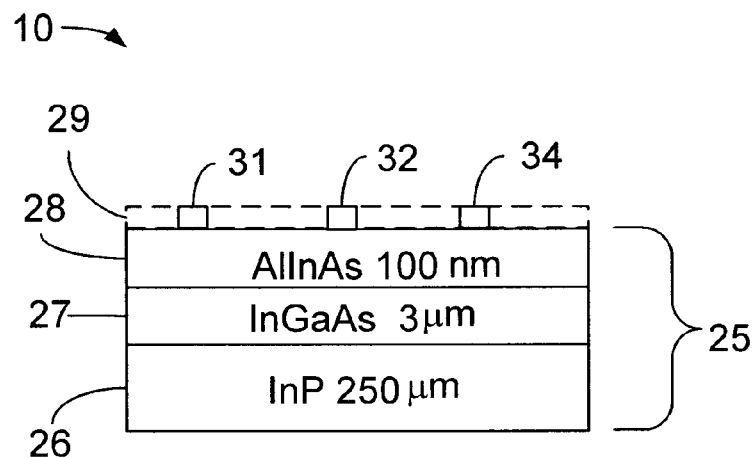
FIG. 7A is a cross-sectional view of the layers of a metal-semiconductor-metal (MSM) wafer within which the polarity-independent optical receiver of the invention is formed.

FIG. 7A is a cross-sectional view of the layers of a metal-semiconductor-metal (MSM) wafer 25 within which the polarity-independent optical receiver 10 is formed. The polarity-independent optical receiver 10 is constructed by providing a semi-insulating substrate layer 26 of indium phosphide (InP), preferably 250 μm thick. An undoped semiconductor layer 27 of indium gallium arsenide (InGaAs), preferably 3 μm thick, is applied over the indium phosphide substrate layer 26. Then, a 100 nm thick layer 28 of lattice matched semiconductor material, preferably undoped aluminum indium arsenide (AlInAs) is applied over layer 27. The layer 28 may also be undoped indium phosphide (InP). A metal layer 29, preferably a mixture of titanium, platinum and gold (TiPtAu) is then applied over semiconductor layer 28. The metal layer 29 is then selectively removed during a single etching, or lift-off step to define interdigitated electrodes 31, 32 and 34. The titanium, platinum and gold metal layer 29 is known to those having ordinary skill in the art of applying electrical voltages to semiconductors. Hence, construction of the polarity-independent optical receiver 10 is simple because a single mask and etch operation defines the electrodes. Alternatively, other techniques may be used to define the electrodes.

Schottky diodes corresponding to the photodiodes D1 through D4 are formed at the metal to semiconductor interface between semiconductor layer 28 and the metal electrodes 31, 32 and 34, where the metal forms the anode of each photodiode. Furthermore, the current generated by the photodiodes D1 through D4 flows in the InGaAs (layer 27), in which photons are absorbed to place electrons and holes into conduction. The AlInAs layer 28, known as a high-bandgap semiconductor, has a higher energy gap and does not absorb light. The holes and electrons then move towards opposite electrodes under the influence of the electric field created by the bias voltage applied at the electrodes 31 and 34.

The photodiodes D1 and D2 exist between electrode 31 and the semiconductor layer 28, and between the semiconductor layer 28 and electrode 32, respectively. Photodiodes D1 and D2 are oppositely oriented and are electrically connected in series between electrode 31 and electrode 32. Similarly, photodiodes D3 and D4 exist between electrode 32 and semiconductor layer 28, and between semiconductor layer 28 and electrode 34, respectively. Photodiodes D3 and D4 are oppositely oriented and are electrically connected in series between electrode 34 and electrode 32.

The AlInAs in layer 28 serves to increase the Schottky barrier height to reduce the dark current. The dark current is the undesirable current that flows through the photodiodes in the absence of light.

Figure 7B:
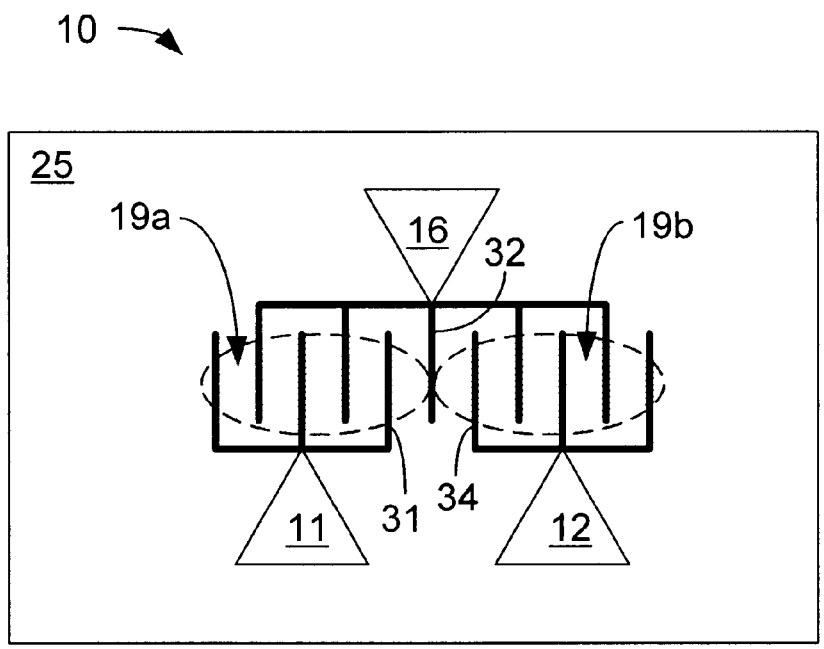
FIG. 7B is a plan view illustrating, in further detail, the polarity-independent optical receiver of FIG. 7A.

FIG. 7B is a view illustrating, in further detail, the polarity-independent optical receiver 10 of FIG. 7A. Terminal 11 is connected to electrode 31, terminal 12 is coupled to electrode 34 and terminal 16 is coupled to electrode 32. Electrodes 31, 32 and 34 reside in the illuminated regions 19a and 19b of wafer 25 in which the photodiodes D1 through D4 are formed as stated above. Illuminated regions 19a and 19b are the regions on the surface of wafer 25 upon which the incident light falls and in which photodiodes D1 through D4 are located between the electrodes 31, 32 and 34, and the semiconductor layer 28.

The photodiodes D1 through D4 are formed at the semiconductor to metal interface and are represented as residing within illuminated regions 19a and 19b. For example, region 19a includes photodiodes D1 and D2 and region 19b includes photodiodes D3 and D4 (see FIG. 7D). Region 19a is an illuminated region in which light applied to photodiodes D1 and D2 is absorbed and region 19b is an illuminated region in which light applied to photodiodes D3 and D4 is absorbed. An electric field applied by the interdigitated electrodes 31, 32 and 34 within regions 19a and 19b sweeps the charge from the regions 19a and 19b, thus creating an electrical current in the optical receiver 10.

Figure 7C:
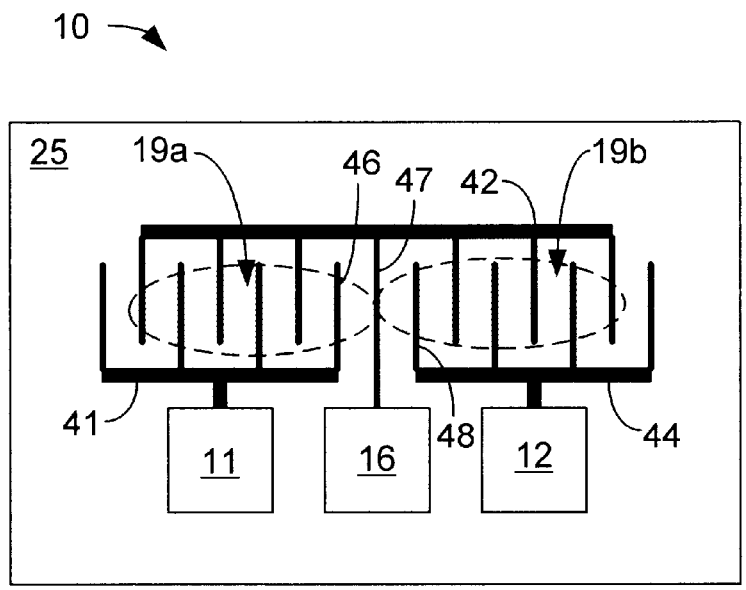
FIG. 7C is a plan view schematically illustrating a preferred embodiment of the polarity-independent optical receiver of FIGS. 7A and 7B.

FIG. 7C is a plan view schematically illustrating a preferred embodiment of the polarity-independent optical receiver 10 of FIGS. 7A and 7B including preferred dimensions of the electrodes. The electrode portions 41, 42 and 44 are preferably formed of a 10 μm wide layer of titanium, platinum and gold. The electrode portions 46, 47 and 48 are preferably formed of 0.5–1 μm wide layers of titanium, platinum and gold, and preferably extend 70 μm from electrode portions 41, 42 and 44, respectively. Electrode portions 46, 47 and 48 are interdigitated and are preferably paced 3–5 μm apart. The terminals 11, 12 and 16 are preferably 80 μm square and formed using titanium, platinum and gold.

In an alternative embodiment, the electrode portions 41, 42 and 44, and the electrode portions 46, 47 and 48 may be formed using Indium Tin Oxide (ITO), which is semi-transparent so as to reduce optical loss. The dimensions given above are for example purposes only and may be altered to optimize the performance of the optical receiver 10.

In this manner, the polarity-independent optical receiver 10 can be fabricated using MSM technology, thereby increasing reliability and simplifying fabrication.

Figure 7D:
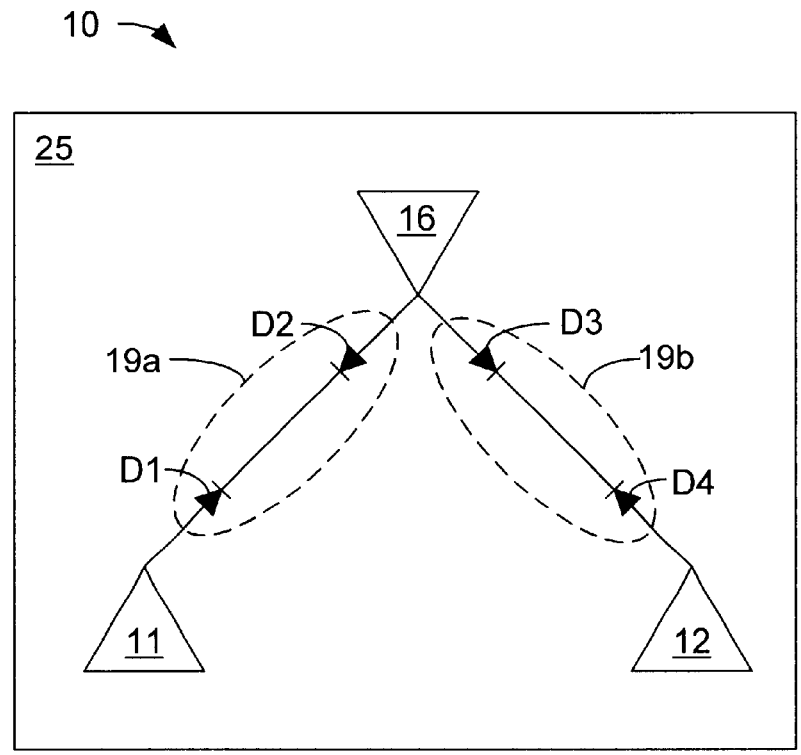
FIG. 7D is a plan view schematically illustrating the polarity-independent optical receiver of FIG. 7A.

FIG. 7D is a plan view schematically illustrating the polarity-independent optical receiver 10 of FIG. 7A. Photodiodes D1, D2, D3 and D4 are illustrated in FIG. 7D arranged in the preferred embodiment as shown above with respect to FIG. 3. Regions 19a and 19b are the illuminated regions on wafer 25, corresponding to the location of photodiodes D1 through D4, upon which light falls. The light generates carriers in the semiconductor layer 28 (FIG. 7A) that migrate towards the photodiodes D1 through D4 (serially connected between the electrodes 31, 32 and 34 of FIGS. 7A and 7B), thus enabling electrical conduction in the photodetector.

In another alternative embodiment, an integrated lens may be formed on wafer 25 over the regions 19a and 19b. The lens can be formed so as to improve the coupling of light to the photodiodes D1 through D4. Furthermore, an anti-reflective coating may be applied to the wafer surface so as to reduce any negative effects caused by the difference in the index of refraction between the air surrounding the water 25 and the surface of the wafer. The anti-reflective coating may be applied over the wafer surface or over the lens that may be applied over the wafer surface.

Figure 7E:
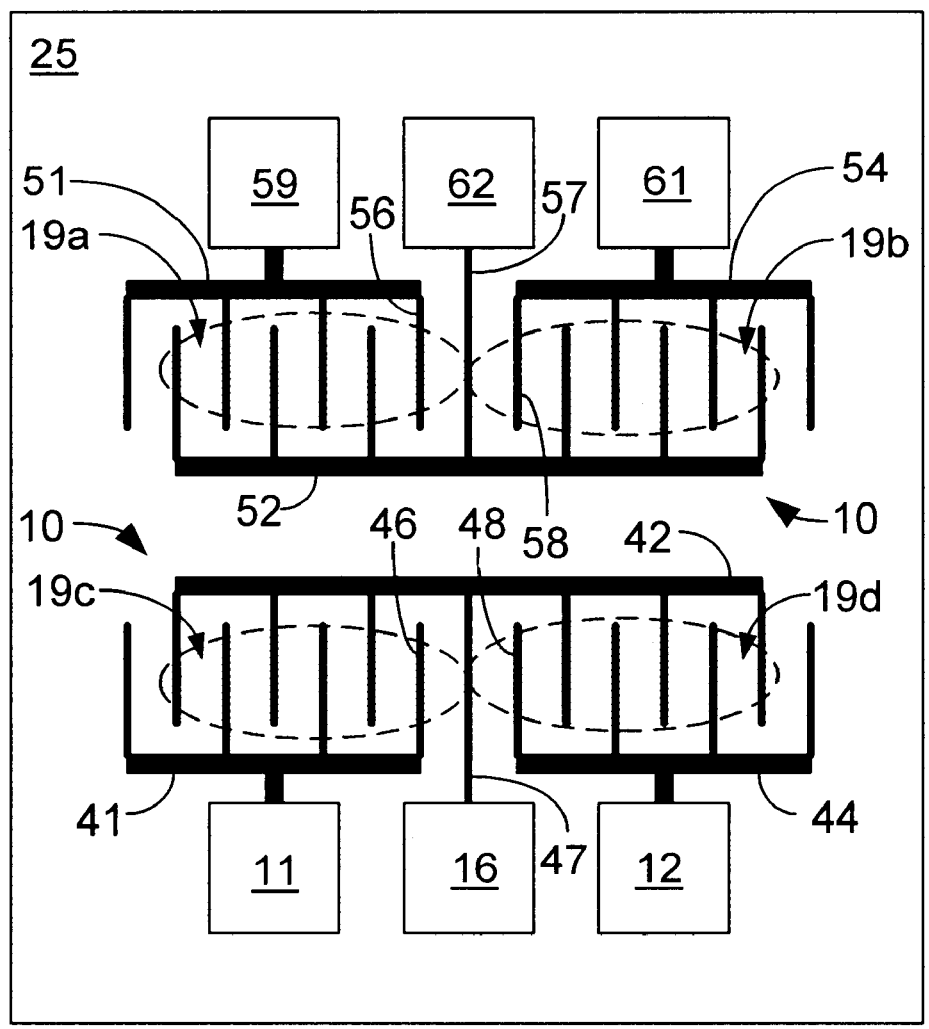
FIG. 7E is a plan view illustrating an alternative embodiment of the polarity-independent optical receiver of FIG. 7C.

FIG. 7E is a plan view illustrating an alternative embodiment of the polarity-independent optical receiver of FIG. 7C. The polarity-independent optical receiver 50 includes a pair of polarity-independent optical receivers 10 located adjacent one another on the surface of the wafer 25. The polarity-independent optical receiver 50 is fabricated on wafer 25 by defining an additional set of electrodes 51, 52, 54, 56, 57 and 58 similar to the electrodes 41, 42, 44, 46, 47 and 48, respectively, in the metal layer 29. The electrode 51 is connected to terminal 51, the electrode 52 is connected to additional common terminal 62, and electrode 54 is connected to terminal 61. The polarity-independent optical receiver 50 detects four light beams that illuminate the surface of the wafer 25 in the regions 19a, 19b, 19c and 19d. Such a polarity-independent optical receiver 50 can be used in applications in which two balanced detectors are used to achieve intensity noise suppression and polarization diversity. Examples of such applications are disclosed in U.S. patent application Ser. No. 09/506,196, assigned to the Assignee of this disclosure and incorporated herein by reference.

It will be apparent to those skilled in the art that many modifications and variations may be made to the preferred embodiments of the invention, as set forth above, without departing substantially from the principles of the invention. All such modifications and variations are intended to be included herein within the scope of the invention, as defined in the claims that follow.

What is claimed is:

1. A polarity-independent optical receiver, comprising:
    a first pair of photodiodes serially connected between a first terminal and a common terminal;
    a second pair of photodiodes serially connected between a second terminal and said common terminal; and
    wherein each of said photodiodes in said first pair and said second pair is oppositely oriented such that a polarity-independent bias voltage may be applied to said first terminal and said second terminal.

2. The optical receiver of claim 1, wherein said first pair of photodiodes and said second pair of photodiodes are configured in a balanced arrangement.

3. The optical receiver of claim 2, wherein said common terminal is a virtual common-mode ground terminal coupled between said first pair of photodiodes and said second pair of photodiodes, said virtual common-mode ground terminal configured to supply an output signal to an electronic amplifier.

4. The optical receiver of claim 1, further comprising a semiconductor configured to support said first pair of photodiodes and said second pair of photodiodes.

5. The optical receiver of claim 4, additionally comprising:
    a third pair of oppositely oriented photodiodes connected in series between a third terminal and an additional common terminal, and located adjacent said first pair of photodiodes; and
    a fourth pair of oppositely oriented photodiodes connected in series between a fourth terminal and said additional common terminal, and located adjacent said second pair of photodiodes.

6. The optical receiver of claim 4, wherein said semiconductor is metal-semiconductor-metal (MSM).

7. The optical receiver of claim 6, further comprising a plurality of interdigitated electrodes formed over said semiconductor.

8. The optical receiver of claim 7, wherein said interdigitated electrodes include Indium Tin Oxide (ITO).

9. The optical receiver of claim 4, wherein an integrated lens is located over said first pair of photo diodes and said second pair of photodiodes.

10. The optical receiver of claim 9, further comprising an anti-reflective coating over said lens.

11. The optical receiver of claim 4, further comprising an anti-reflective coating over said semiconductor.

12. A method for making a polarity-independent optical receiver, the method comprising the steps of:
    forming a first pair of photodiodes serially connected between a first terminal and a common terminal;
    forming a second pair of photodiodes serially connected between a second terminal and said common terminal; and
    oppositely orienting each of said photodiodes in said first pair and said second pair such that a polarity-independent bias voltage may be applied to said first terminal and said second terminal.

13. The method of claim 12, further comprising the step of configuring said first pair of photodiodes and said second pair of photodiodes in a balanced arrangement.

14. The method of claim 13, further comprising the step of supplying an output signal from said common terminal to an electronic amplifier.

15. The method of claim 12, further comprising the step of fabricating said first pair of photodiodes and said second pair of photodiodes on a semiconductor.

16. The method of claim 15, further comprising the steps of:
    forming a third pair of oppositely oriented photodiodes connected in series between a third terminal and an additional common terminal, and located adjacent said first pair of photodiodes; and
    forming a fourth pair of oppositely oriented photodiodes connected in series between a fourth terminal and said additional common terminal, and located adjacent said second pair of photodiodes.

17. The method of claim 15, wherein said semiconductor is metal-semiconductor-metal (MSM).

18. The method of claim 17, further comprising the step of forming a plurality of interdigitated electrodes over said semiconductor.

19. The method of claim 18, wherein said interdigitated electrodes are formed of Indium Tin Oxide (ITO).

20. The method of claim 15, further comprising the step of locating an integrated lens over said first pair of photodiodes and said second pair of photodiodes.

21. The d of claim 20, further comprising the step of applying an anti-reflective coating over said lens.

22. The method of claim 15, further comprising the step of applying an anti-reflective coating over said semiconductor.

* * * * *